(12) United States Patent
Song et al.

(10) Patent No.: US 9,490,226 B2
(45) Date of Patent: Nov. 8, 2016

(54) INTEGRATED DEVICE COMPRISING A HEAT-DISSIPATION LAYER PROVIDING AN ELECTRICAL PATH FOR A GROUND SIGNAL

(71) Applicant: QUALCOMM Incorporated, San Diego, CA (US)

(72) Inventors: Young Kyu Song, San Diego, CA (US); Hong Bok We, San Diego, CA (US); Dong Wook Kim, San Diego, CA (US); Kyu-Pyung Hwang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/462,265

(22) Filed: Aug. 18, 2014

(65) Prior Publication Data

US 2016/0049378 A1    Feb. 18, 2016

(51) Int. Cl.
*H01L 23/52*    (2006.01)
*H01L 23/00*    (2006.01)
(Continued)

(52) U.S. Cl.
CPC ........... *H01L 24/17* (2013.01); *H01L 21/4857* (2013.01); *H01L 23/34* (2013.01); *H01L 23/3735* (2013.01); *H01L 23/49811* (2013.01); *H01L 23/49822* (2013.01); *H01L 24/11* (2013.01); *H01L 24/81* (2013.01);
(Continued)

(58) Field of Classification Search
CPC .......... H01L 2924/00014; H01L 2224/73265; H01L 2224/32225; H01L 2224/16225; H01L 2224/48227; H01L 2345/15311; H01L 2224/48091; H01L 2224/73204; H01L 2224/97; H01L 2224/32245; H01L 2924/00012; H01L 24/17; H01L 23/367; H01L 24/11; H01L 24/81; H01L 2224/16227; H01L 2224/17519
USPC ....................................................... 257/691
See application file for complete search history.

(56) References Cited

U.S. PATENT DOCUMENTS 6,847,110 B2    1/2005  Akram et al.
7,115,986 B2 *  10/2006 Moon ................. H01L 23/4985
                                                        257/686

(Continued)

FOREIGN PATENT DOCUMENTS

EP        1261028 A2    11/2002

OTHER PUBLICATIONS

International Search Report and Written Opinion—PCT/US2015/045288—ISA/EPO—Nov. 24, 2015.

*Primary Examiner* — Tod T Van Roy
*Assistant Examiner* — Vu A Vu
(74) *Attorney, Agent, or Firm* — Loza & Loza, LLP

(57) ABSTRACT

Provided herein is an integrated device that includes a substrate, a die, a heat-dissipation layer located between the substrate and the die, and a first interconnect configured to couple the die to the heat-dissipation layer. The heat-dissipation layer may be configured to provide an electrical path for a ground signal. The first interconnect may be further configured to conduct heat from the die to the heat-dissipation layer. The integrated device may also include a second interconnect configured to couple the die to the substrate. The second interconnect may be further configured to conduct a power signal between the die and the substrate. The integrated device may also include a dielectric layer located between the heat-dissipation layer and the substrate, and a solder-resist layer located between the die and the heat-dissipation layer.

33 Claims, 14 Drawing Sheets

(51) Int. Cl.
*H01L 23/34* (2006.01)
*H01L 23/373* (2006.01)
*H01L 23/498* (2006.01)
*H01L 21/48* (2006.01)
*H05K 1/02* (2006.01)

(52) U.S. Cl.
CPC ...... *H05K 1/0207* (2013.01); *H01L 23/49816* (2013.01); *H01L 2224/16227* (2013.01); *H01L 2224/17519* (2013.01)

(56) References Cited

U.S. PATENT DOCUMENTS

| | | | |
|---|---|---|---|
| 7,122,905 B2 * | 10/2006 | Grigg | 257/778 |
| 7,459,346 B2 | 12/2008 | Yee et al. | |
| 7,781,880 B2 | 8/2010 | Egawa | |
| 8,022,532 B2 * | 9/2011 | Kasuya et al. | 257/707 |
| 8,102,046 B2 | 1/2012 | Iwata et al. | |
| 2002/0038908 A1 * | 4/2002 | Ding | H01L 23/3128 257/720 |
| 2002/0185718 A1 | 12/2002 | Mikubo et al. | |
| 2003/0147227 A1 | 8/2003 | Egitto et al. | |
| 2007/0102829 A1 | 5/2007 | Lo et al. | |
| 2011/0210436 A1 * | 9/2011 | Chow | H01L 21/563 257/686 |
| 2011/0248389 A1 * | 10/2011 | Yorita et al. | 257/659 |
| 2012/0261166 A1 * | 10/2012 | Oh | H05K 1/0206 174/252 |
| 2012/0280404 A1 * | 11/2012 | Kwon | H01L 23/3737 257/777 |

* cited by examiner

INTEGRATED DEVICE COMPRISING A HEAT-DISSIPATION LAYER PROVIDING AN ELECTRICAL PATH FOR A GROUND SIGNAL

BACKGROUND

1. Field

Various features relate, generally, to an integrated device and, more specifically, to an integrated device including a heat-dissipation layer providing an electrical path for a ground signal.

2. Background

FIG. 1 illustrates a conventional package 100. The conventional package 100 includes a substrate 102, a die 104, and solder balls 106. The solder balls 106 may electrically connect the substrate 102 with the die 104. The package 100 may include an integrated heat spreader (IHS)/heat sink 108. The HIS/heat sink 108 may contact the die 104 and/or substrate 102. The HIS/heat sink 108 may have a horizontal portion 110 and one or more vertical portions 112. During operation of the conventional package 100, the die 104 and/or the substrate 102 may generate heat. The heat may spread to the HIS/heat sink 108. The HIS/heat sink 108 may be exposed to air, and the heat may dissipate into the air.

Notably, the IHS/heat sink 108 is not located between the die 104 and the substrate 102. Also, the HIS/heat sink 108 provides no electrical path for a ground signal. Because the HIS/heat spreader 108 cannot route ground signals, a greater number of solder balls 106 may be need to conduct ground signals (e.g., from the die 104 to the substrate 102). An increase in the number of interconnects 106 may undesirably increase the size of the conventional package 100. Existing designs may benefit from enhancements that reduce the size of the conventional package 100.

SUMMARY

The following presents a simplified summary of one or more examples and/or aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various features, apparatus and methods described herein pertain to an integrated device. A first example provides an integrated device that includes a substrate, a die, a heat-dissipation layer located between the substrate and the die, and a first interconnect configured to couple the die to the heat-dissipation layer. The heat-dissipation layer may be configured to provide an electrical path for a ground signal. The first interconnect may be further configured to conduct heat from the die to the heat-dissipation layer. The integrated device may also include a second interconnect configured to couple the die to the substrate. The second interconnect may be further configured to conduct a power signal between the die and the substrate. The integrated device may also include a dielectric layer located between the heat-dissipation layer and the substrate, and a solder-resist layer located between the die and the heat-dissipation layer. The integrated device may be incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a substrate, a die, means for heat dissipation located between the substrate and the die, and a first interconnect configured to couple the die to the means for heat dissipation. The means for heat dissipation may be configured to provide an electrical path for a ground signal. The first interconnect may be further configured to conduct heat from the die to the means for heat dissipation. The apparatus may also include a second interconnect configured to couple the die to the substrate. The second interconnect may also be further configured to conduct a power signal between the die and the substrate. The apparatus may also include a dielectric layer located between the means for heat dissipation and the substrate, and a solder-resist layer located between the die and the means for heat dissipation. The apparatus may be incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides an apparatus that includes a substrate comprising a first trace and a second trace, a first pad coupled to the first trace, a second pad couple to the second trace, and a heat-dissipation layer coupled to the second pad and configured to provide an electrical path for a ground signal. The second pad may be configured to conduct heat from the substrate to the heat-dissipation layer. The first pad and the first trace may be configured to provide an electrical path for a power signal. The second pad and the second trace may be configured to provide an electrical path for a ground signal. The apparatus may also include a dielectric layer located between the heat-dissipation layer and the substrate. The apparatus may also include a solder-resist layer located above at least a portion of the heat-dissipation layer. The apparatus may be incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A fourth example provides a method of fabricating an integrated device. The method includes providing a heat-dissipation layer above a substrate, and providing a first interconnect coupled to a die. The heat-dissipation layer may be coupled to the first interconnect and configured to provide an electrical connection for a ground signal. The method may also include providing a pad above the substrate prior to providing the heat-dissipation layer. The method may also include providing a dielectric layer above the substrate prior to providing the heat-dissipation layer. The method may also include providing a solder-resist layer above at least a portion of the heat-dissipation layer prior to providing the first interconnect. The first interconnect may be configured to conduct heat from the die to the heat-dissipation layer. The method may also include providing a second interconnect. The second interconnect may be configured to conduct a power signal between the die and the substrate. The method may be performed by an integrated device that is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

These and other examples and/or aspects of the disclosure will become more fully understood upon a review of the detailed description, which follows. Other aspects, features, and embodiments of the present disclosure will become apparent to those of ordinary skill in the art, upon reviewing the following description of specific, exemplary embodiments of the present disclosure in conjunction with the accompanying figures.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Many novel features pertain to an integrated device that includes a substrate, a die, a heat-dissipation layer (e.g., means for heat dissipation) located between the substrate and the die, and a first interconnect configured to couple the die to the heat-dissipation layer. The heat-dissipation layer may be configured to provide an electrical path for a ground signal. The first interconnect may be further configured to conduct heat from the die to the heat-dissipation layer. The integrated device may also include a second interconnect configured to couple the die to the substrate. The second interconnect may be further configured to conduct a power signal between the die and the substrate. The integrated device may also include a dielectric layer located between the heat-dissipation layer and the substrate, and a solder-resist layer located between the die and the heat-dissipation layer.

Terms and Definitions

An interconnect is an element or component that allows or facilitates an electrical connection between two points, elements and/or components. In some implementations, an interconnect may include a trace, a via, a pad, a pillar, a solder ball, a redistribution metal layer, and/or an under bump metallization (UBM) layer. In some implementations, an interconnect is an electrically conductive material that provides an electrical path for a signal (e.g., data signal, ground signal, power signal). An interconnect may include more than one element/component.

Exemplary Integrated Devices

Figure 1:
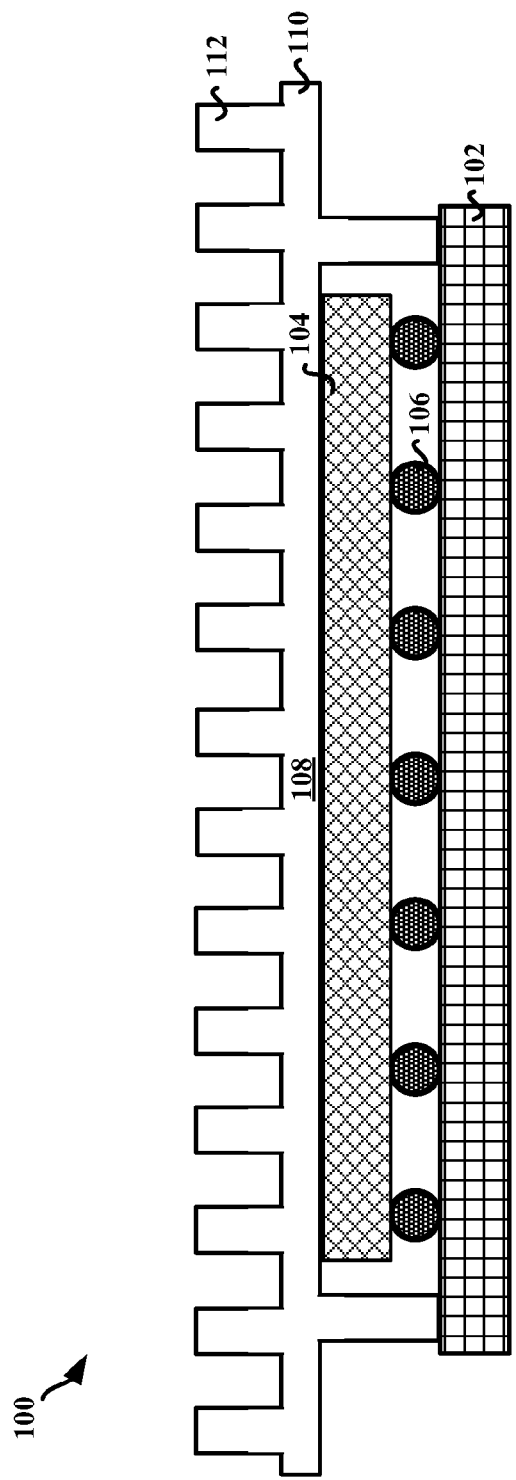
FIG. 1 illustrates a first exemplary integrated device.
Figure 2:
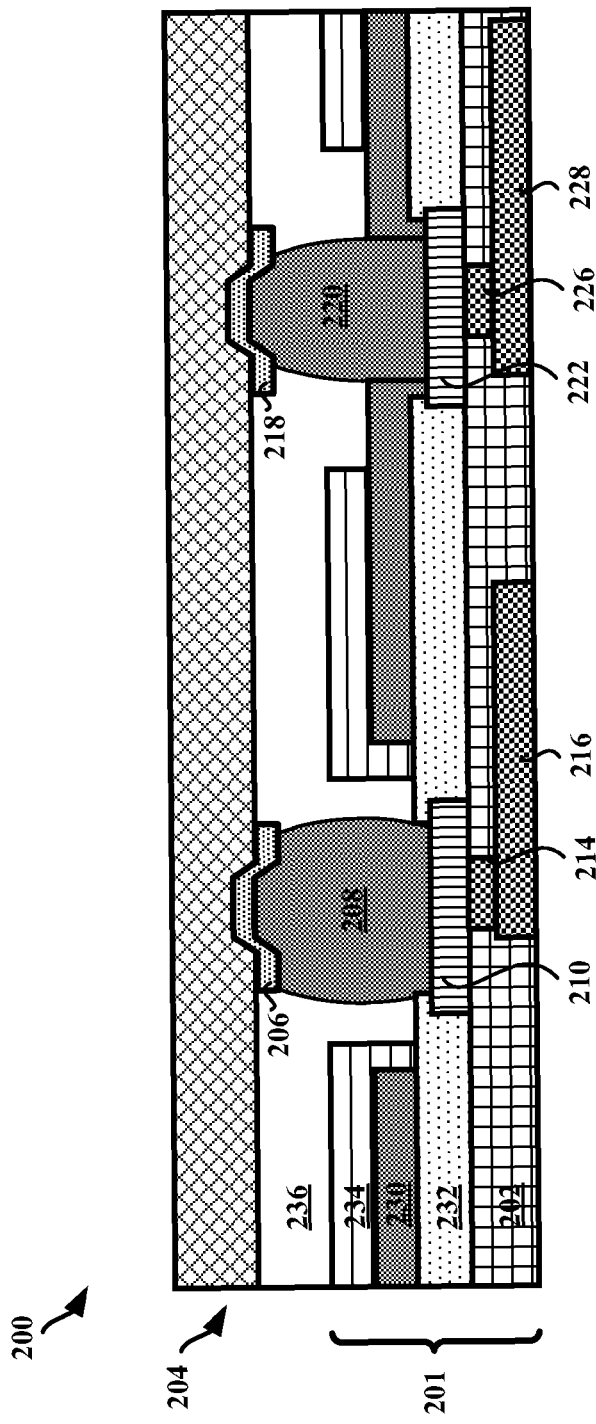
FIG. 2 illustrates a second exemplary integrated device.

FIG. 2 illustrates an exemplary integrated device 200 that includes a substrate 201 and a die 204. The substrate 201 may include various materials without deviating from the scope of the present disclosure. As non-limiting examples, the substrate 201 may include silicon, glass, ceramic, a wafer, dielectrics and/or various organic materials. In FIG. 2, the substrate 201 includes a dielectric layer 202 and various configurations of metal layers. For example, the substrate 201 may include various configurations of vias 214, 226 and/or traces 216, 228. A trace (e.g., traces 216, 228) may be any material that can conduct electrical signals in a first direction (e.g., horizontally or laterally). A via (e.g., vias 214, 226) may be any material that can conduct electrical signals in a second direction (e.g., vertically). The traces 216, 228 and/or vias 214, 226 may include various materials without deviating from the scope of the present disclosure. The vias 214, 226 may be respectively coupled to the traces 216, 228 such that an electrical signal can be conducted from one to the other. The vias 214, 226 and/or traces 216, 228 may be at least partially surrounded by a dielectric material. As a non-limiting example, the dielectric material may include silicon nitrade (SiN). The substrate 201 may also include additional elements that will be readily known to one of ordinary skill in the art. One of ordinary skill in the art will understand that various other elements may be included in the substrate 201 without deviating from the scope of the present disclosure.

The substrate 201 includes a first pad 210, a second pad 222, a first dielectric layer 232, a heat dissipation layer 230, and a solder resist layer 234. The first pad 210 is coupled to the via 214. The second pad 222 is coupled to the via 226. The dielectric layer 232 is located on the substrate 201. There are cavities in the dielectric layer 232 over the first pad 210 and the second pad 222. The heat dissipation layer 230 also includes several cavities.

The die 204 may include a first under bump metallization (UBM) layer 206, a first solder ball 208, a second UBM layer 218, a first solder ball 208, and a second solder ball 220. The die 204 may be an integrated circuit or any other semiconducting material having one or more circuits (e.g., active circuits). The first UBM layer 206 is coupled to the first solder ball 208, and the second UBM layer 218 is coupled to the second solder ball 220. It should be noted that in some implementations, instead of a UBM layer, the die 204 may include other types of interconnects, including for example pads. These pads may be coupled to respective solder balls.

The first solder ball 208 is coupled to the pad 210, and the second solder ball 220 is coupled to the pad 222. The solder ball 220 and the pad 222 are also coupled to the heat dissipation layer 230. However, the first solder ball 208 and the pad 210 are not directly in physically contact with the heat dissipation layer 230.

In some implementations, the substrate 201 may be electrically coupled to the die 204 through the trace 216, the via 214, the pad 210, the solder ball 208, and/or the first UBM layer 206. In some implementations, the trace 216, the via 214, the pad 210, the solder ball 208, and/or the first UBM layer 206 are a combination of interconnects that provides an electrical path for a signal (e.g., power signal, data signal) from the substrate 201 to the die 204. However, alternative and/or additional paths and/or elements may exist in each of the electrical paths of the power signals without deviating from the scope of the present disclosure.

In some implementations, the die 204 may be electrically coupled to the substrate 201 through the second UBM layer 218, the second solder ball 220, the heat dissipation layer 230, the pad 222, the via 226, and/or the trace 228. In some implementations, the second UBM layer 218, the second solder ball 220, the heat dissipation layer 230, the pad 222, the via 226, and/or the trace 228 are a combination of interconnects that provides an electrical path for a signal (e.g., ground signal) from the die 204 to the substrate 201. However, alternative and/or additional paths and/or elements may exist in each of the electrical paths of the power signals without deviating from the scope of the present disclosure.

Turning to solder ball 220, a portion of the solder ball 220 is coupled to the heat-dissipation layer 230. Also, a portion of the pad 222 is coupled to the heat-dissipation layer 230. Accordingly, a connection exists between the solder ball 220 and the heat-dissipation layer 230. Alternative and/or alternative connections may exists between the solder ball 220 and the heat-dissipation layer 230 without deviating from the scope of the present disclosure. Because the solder ball 220 is also coupled to the die 204 (e.g., via UBM 218), a connection exists between the die 204 and the heat-dissipation layer 230. The connection between the die 204 and the heat-dissipation layer 230 provides an electrical path for a ground signal (e.g., an electrical signal destined to/for ground) from the die 204 to the heat-dissipation layer 230. The heat-dissipation layer 230 provides a means for heat dissipation. The means for heat dissipation may be any material that can conduct heat and/or electricity. The means for heat dissipation may be a heat-dissipater, a heat sink, or other similar element without deviating from the scope of the present disclosure. The means for heat dissipation may include various materials without deviating from the scope of the present disclosure. By distributing heat away from the source region (e.g., the region immediately surrounding solder ball 220, die) to other regions (e.g., regions away from the region immediately surrounding solder ball 220, die), the likelihood of the integrated device overheating at the source region (e.g., the region immediately surrounding solder ball 220, die) is reduced. In some implementations, the means for heat dissipation is configured in such a way that at least a majority of heat generated (e.g., substantially all of the heat generated) by the die is dissipated through the means for heat dissipation. Additionally, the means for heat dissipation may provide an electrical path for a ground signal. Further description of the electrical path provided by the heat-dissipation layer 230 (e.g., means for heat dissipation) is provided infra with reference to FIG. 3.

The aforementioned connection between the solder ball 220 and the heat-dissipation layer 230 may (also) provide a path for heat dissipation and/or heat dissipation from the die 204 to the heat-dissipation layer 230. The heat-dissipation layer 230 may be any material that can conduct heat and/or electricity. The heat-dissipation layer 230 may be a heat-dissipater, a heat sink, or other similar element without deviating from the scope of the present disclosure. The heat-dissipation layer 230 may include various materials without deviating from the scope of the present disclosure. By distributing heat away from the source region (e.g., the region immediately surrounding solder ball 220) to other regions (e.g., regions away from the region immediately surrounding solder ball 220), the likelihood of the integrated device 200 overheating at the source region (e.g., the region immediately surrounding solder ball 220) is reduced. In some implementations, the heat dissipation layer 230 is configured in such a way that at least a majority of heat generated (e.g., substantially all of the heat generated) by the die 204 is dissipated through the heat dissipation layer 230.

The pads 210, 222, 310, 322 are formed from a metal layer, as will be discussed in greater detail infra with reference to FIGS. 4A-4H. As discussed supra, the vias 214, 226 may include copper (Cu). Without the pads 210, 222, the vias 214, 226 may be exposed to air. The exposure of copper to air may cause the copper to oxidize. Oxidization of the vias 214, 226 may undesirably reduce the conductivity of the vias 214, 226. Accordingly, providing the pads 210, 222 may help reduce or prevent the oxidization of the vias 214, 226.

A dielectric layer 232 may separate at least a portion of the heat-dissipation layer 230 from the substrate 201. The dielectric layer 232 layer may include various materials without deviating from the scope of the present disclosure. As a non-limiting example, the dielectric layer 232 may include SiN. The dielectric layer 232 may prevent the inadvertent transfer of electrical signals (e.g., ground signals and/or power signals) and/or heat from the heat-dissipation layer 230 to the substrate 201 (except, of course, where a connection exists between the heat-dissipation layer 230 and an solder ball, such as solder ball 220, as described supra). Additional description related to the formation of the dielectric layer 232 is provided infra with reference to FIGS. 4A-4I.

A solder-resist layer 234 may be located above the heat-dissipation layer 230. The solder-resist material 234 may prevent some of the solder balls (e.g., solder ball 208) from coupling to the heat-dissipation layer 230 during the fabrication process of the integrated device 200. Where the solder-resist layer 234 is not applied above the heat-dissipation layer 230, a solder ball (e.g., solder ball 220) may become coupled to the heat-dissipation layer 230. Additional description related to the fabrication of the solder-resist layer 234 is provided infra with reference to FIGS. 4A-4H.

The underfill 236 may be provided (e.g., injected or inserted) into the space underneath the die 204. The underfill 236 may provide structural and/or mechanical support to the integrated device 200, particularly to the die 204, the UBMs 206, 218, and the solder balls 208, 220.

Figure 3:
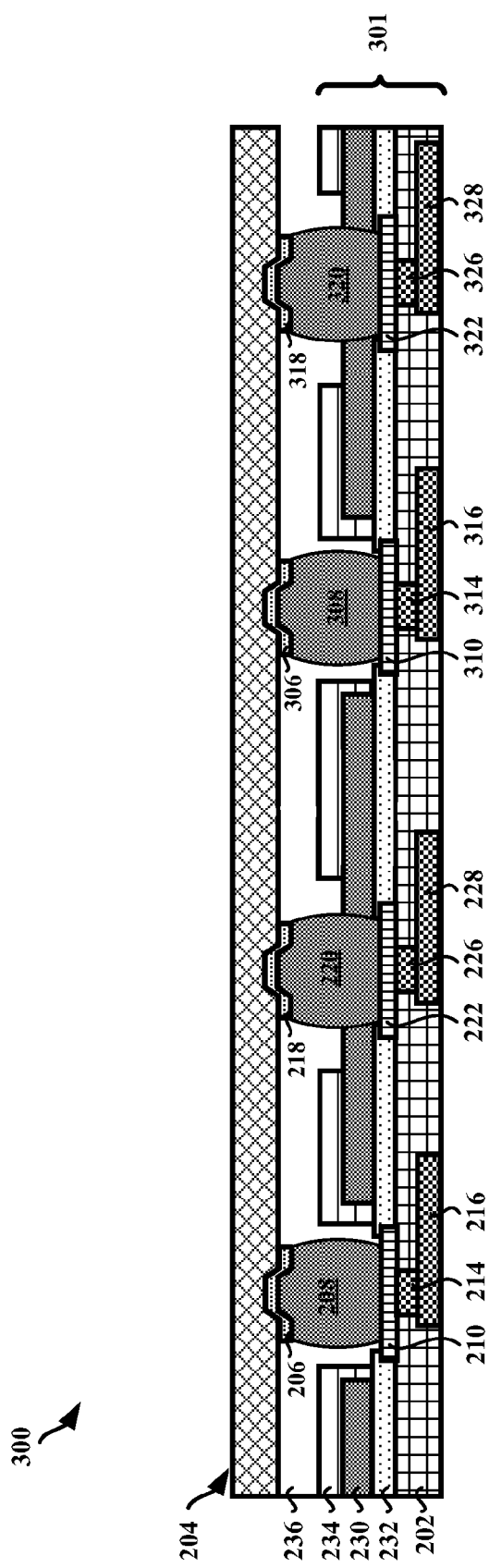
FIG. 3 illustrates a third exemplary integrated device.

FIG. 3 illustrates an integrated device 300 that is similar to the integrated device 200 illustrated in FIG. 2. In FIG. 3, more interconnects are illustrated. Specifically, FIG. 3 illustrates an exemplary integrated device 300 that includes the substrate 301 and the die 204. The substrate 301 may include various materials without deviating from the scope of the present disclosure. As non-limiting examples, the substrate 201 may include silicon, glass, ceramic, a wafer, dielectrics and/or various organic materials. In FIG. 3, the substrate 301 includes a dielectric layer 202 and various configurations of metal layers. The substrate 301 may also include various configurations of metal layers. For example, the substrate 301 may include various configurations of vias 214, 226, 314, 326 and/or traces 216, 228, 316, 328. A trace (e.g., traces 216, 228) may be any material that can conduct electrical signals in a first direction (e.g., horizontally or laterally). A via (e.g., vias 214, 226) may be any material that can conduct electrical signals in a second direction (e.g., vertically). The vias 214, 226, 314, 326 may be respectively coupled to the traces 216, 228, 316, 328 such that an electrical signal can be conducted from one to the other. The vias 214, 226, 314, 326 and/or traces 216, 228, 316, 328 may be at least partially surrounded by a dielectric material. As a non-limiting example, the dielectric material may include silicon nitrade (SiN). The substrate 201 may also include additional elements that will be readily known to one of ordinary skill in the art. One of ordinary skill in the art will understand that various other elements may be included in the substrate 201 without deviating from the scope of the present disclosure.

The substrate 301 includes a first pad 210, a second pad 222, a third pad 310, a fourth pad 322, a first dielectric layer 232, a heat dissipation layer 230, and a solder resist layer 234. The first pad 210 is coupled to the via 214. The second pad 222 is coupled to the via 226. The third pad 310 is coupled to the via 314. The fourth pad 322 is coupled to the via 326. The dielectric layer 232 is located on the substrate 301. There are cavities in the dielectric layer 232 over the first pad 210, the second pad 222, the third pad 310, and the fourth pad 322. The heat dissipation layer 230 also includes several cavities.

The die 204 may include a first under bump metallization (UBM) layer 206, a first solder ball 208, a second UBM layer 218, a third UBM layer 306, a fourth UBM layer 318, a first solder ball 208, a second solder ball 220, a third solder ball 308, and a fourth solder ball 320. The die 204 may be an integrated circuit or any other semiconducting material having one or more circuits (e.g., active circuits). The first UBM layer 206 is coupled to the first solder ball 208, the second UBM layer 218 is coupled to the second solder ball 220. The third UBM layer 306 is coupled to the third solder ball 308, the fourth UBM layer 318 is coupled to the fourth solder ball 320. It should be noted that in some implementations, instead of a UBM layer, the die 204 may include other types of interconnects, including for example pads. These pads may be coupled to respective solder balls.

The first solder ball 208 is coupled to the pad 210, the second solder ball 220 is coupled to the pad 222, the third solder ball 308 is coupled to the pad 310, and the fourth solder ball 320 is coupled to the pad 322. The solder balls 220, 320 and the pads 222, 322 are also coupled to the heat dissipation layer 230. However, the solder balls 208, 308 and the pads 210, 310 are not directly in physically contact with the heat dissipation layer 230.

In some implementations, the substrate 301 may be electrically coupled to the die 204 through the trace 216, the via 214, the pad 210, the solder ball 208, and/or the first UBM layer 206. In some implementations, the trace 216, the via 214, the pad 210, the solder ball 208, and/or the first UBM layer 206 are a combination of interconnects that provides an electrical path for a signal (e.g., power signal, data signal) from the substrate 301 to the die 204. However, alternative and/or additional paths and/or elements may exist in each of the electrical paths of the power signals without deviating from the scope of the present disclosure.

Similarly, in some implementations, the substrate 301 may be electrically coupled to the die 204 through the trace 316, the via 314, the pad 310, the solder ball 308, and/or the third UBM layer 306. In some implementations, the trace 316, the via 314, the pad 310, the solder ball 308, and/or the third UBM layer 306 are a combination of interconnects that provides an electrical path for a signal (e.g., power signal, data signal) from the substrate 301 to the die 204. However, alternative and/or additional paths and/or elements may exist in each of the electrical paths of the power signals without deviating from the scope of the present disclosure.

In some implementations, the die 204 may be electrically coupled to the substrate 301 through the second UBM layer 218, the second solder ball 220, the heat dissipation layer 230, the pad 222, the via 226, and/or the trace 228. In some implementations, the second UBM layer 218, the second solder ball 220, the heat dissipation layer 230, the pad 222, the via 226, and/or the trace 228 are a combination of interconnects that provides an electrical path for a signal (e.g., ground signal) from the die 204 to the substrate 301. However, alternative and/or additional paths and/or elements may exist in each of the electrical paths of the power signals without deviating from the scope of the present disclosure.

Similarly, in some implementations, the die 204 may be electrically coupled to the substrate 301 through the fourth UBM layer 318, the fourth solder ball 320, the heat dissipation layer 230, the pad 322, the via 326, and/or the trace 328. In some implementations, the fourth UBM layer 318, the fourth solder ball 320, the heat dissipation layer 230, the pad 322, the via 326, and/or the trace 328 are a combination of interconnects that provides an electrical path for a signal (e.g., ground signal) from the die 204 to the substrate 301. However, alternative and/or additional paths and/or elements may exist in each of the electrical paths of the power signals without deviating from the scope of the present disclosure.

Turning to solder ball 320, a portion of the solder ball 320 is coupled to the heat-dissipation layer 230. Also, a portion of the pad 322 is coupled to the heat-dissipation layer 230. Accordingly, a connection exists between the solder ball 320 and the heat-dissipation layer 330. Alternative and/or alternative connections may exists between the solder ball 320 and the heat-dissipation layer 330 without deviating from the scope of the present disclosure. Because the solder ball 220 is also coupled to the die 204 (e.g., via UBM 318), a connection exists between the die 204 and the heat-dissipation layer 230. The connection between the die 204 and the heat-dissipation layer 230 provides an electrical path for a ground signal (e.g., an electrical signal destined to/for ground) from the die 204 to the heat-dissipation layer 230. The heat-dissipation layer 230 provides a means for heat dissipation. The means for heat dissipation may provide an electrical path for a ground signal.

In the foregoing non-limiting example, the heat-dissipation layer 230 provides an electrical path or electrical coupling (e.g., ground coupling) between the solder ball 220 and the solder ball 320. By using the heat-dissipation layer 230 to route the electrical signals (e.g., ground signal) from the die 204, through the solder ball 224 and/or the solder ball 324, fewer connections to interconnects (e.g., ground interconnect) may be needed inside the substrate 301. For instance, interconnects or connection (e.g., interconnect to ground) may not be needed at trace 226 and/or vias 228. Reducing such connections may desirably reduce the size and/or thickness of the integrated device 300. Additional advantages of the integrated device 300 exist and will be readily apparent to one of ordinary skill in the art.

Exemplary Sequences for Providing/Fabricating Exemplary Integrated Devices

FIG. 4 (comprising FIGS. 4A-4H) provides a profile view of illustrations of an integrated device during an exemplary fabrication process. The steps provided in the exemplary fabrication process are merely for illustrative purposes are not intended to limit the scope of the present disclosure. One of ordinary skill in the art will understand that alternative and/or additional steps may be implemented without deviating from the scope of the present disclosure. One of ordinary skill in the art will also understand that any of the steps described herein may be performed in alternative sequences, that some steps may even be separated into sub-steps, and that some steps may even be combined together without deviating from the scope of the present disclosure.

Figure 4A:
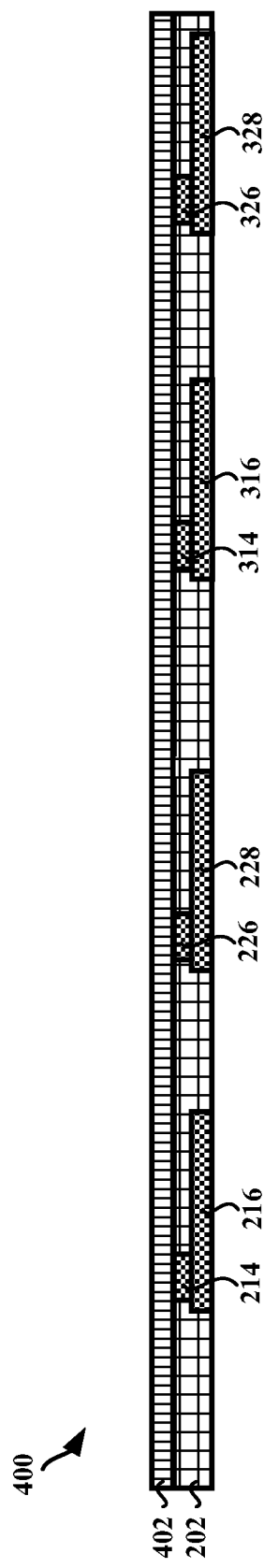
FIG. 4 (comprising FIGS. 4A-4H) illustrates exemplary sequences for providing/fabricating an integrated device.

FIG. 4A illustrates a substrate 400 that includes a dielectric layer 202, traces 214, 226, 314, 326, vias, 216, 228, 316, 328, and a metal layer 402. The substrate 400 may includes more than one dielectric layers and/or additional interconnects (e.g., traces, vias). The metal layer 402 may be provided on the dielectric layer 202 using a plating process. The metal layer 402 may include the same or similar materials as the pads 210, 222, 310, 322, as discussed in greater detail supra. After the metal layer 402 is provided on the dielectric 202, a portion of the metal layer 402 may be removed (e.g., etched).

Figure 4B:
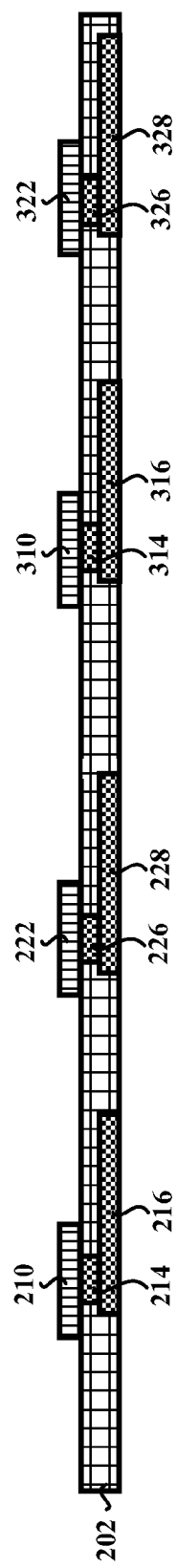

FIG. 4B illustrates the substrate 401 after portions of the metal layer 402 are selectively removed (e.g., selectively etched). Once portions of the metal layer 402 are selectively removed, the remaining portions of the metal layer 402 define at least the pads (e.g., pads 210, 222, 310, 322), as described in greater detail supra. Etching of the metal layer 402 may be performed in a manner that forms the pads 210, 222, 310, 322 above the vias 214, 226, 314, 326 of the substrate 202. As discussed supra, the traces 214, 226, 314, 326 may include Copper (Cu). Without the pads 210, 222, 310, 322, the vias 214, 226, 314, 326 may be exposed to air and consequently oxidize, thereby reducing the conductivity of the vias 214, 226, 314, 326.

Figure 4C:
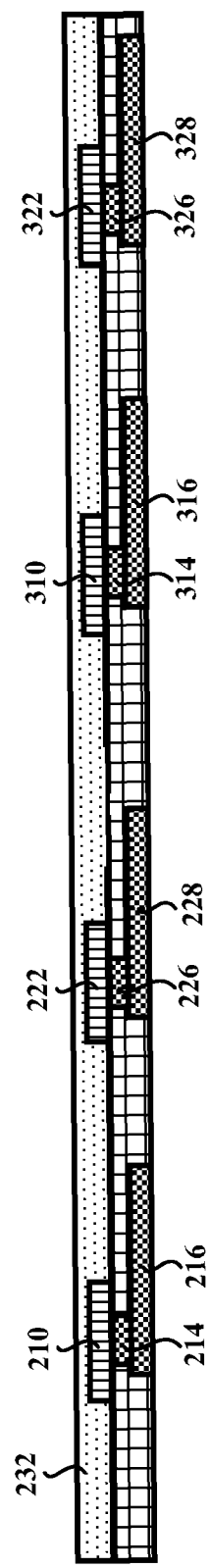
Figure 4D:
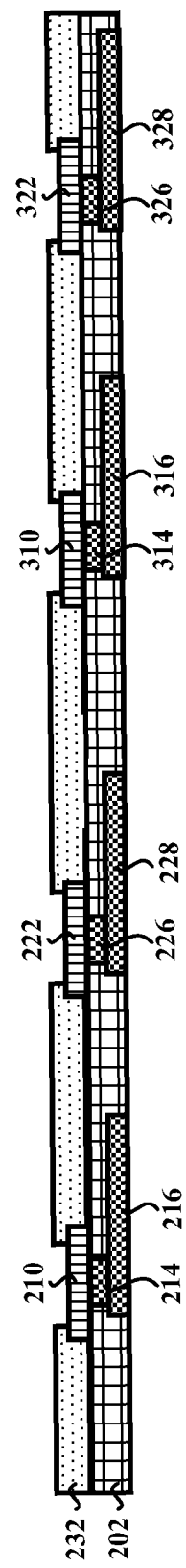

FIG. 4C illustrates the substrate 40 after a dielectric layer 232 is provided (e.g., formed) on the substrate 401. As shown in FIG. 4C, the dielectric layer 232 is formed on top of the pads 210, 222, 310, 322 and the dielectric layer 202. The dielectric layer 232 may provide electrical insulation, as described in greater detail supra. As illustrated in FIG. 4D, a portion of the dielectric layer 232 may be selectively removed (e.g., etched). Etching of the dielectric layer 232 may be performed such that only a portion of the dielectric layer 232 located above the pads 210, 222, 310, 322 is removed, thereby leaving the remaining portions of the dielectric material 232 intact. As such, only a portion of the pads 210, 222, 310, 322 are exposed (e.g., not covered by the dielectric layer 232).

Figure 4E:
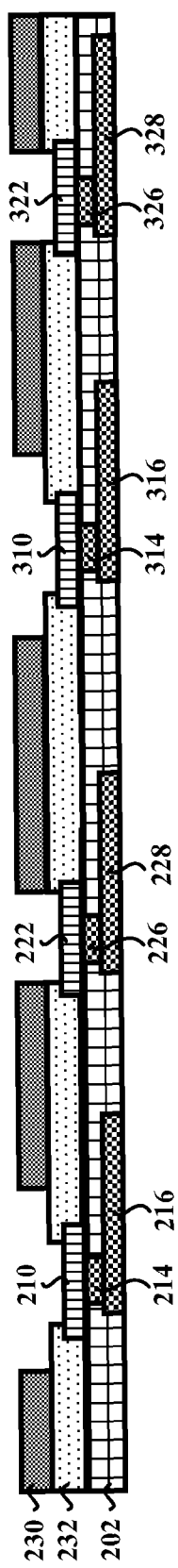

FIG. 4E illustrates the substrate 400 after another metal layer 404 is provided (e.g., formed) on the dielectric layer 232. The metal layer 404 may include the same or similar materials as the heat-dissipation layer 230, as described in greater detail supra. The metal layer 404 is provided (e.g., formed, plated) in such a way as to leave the pads 210, 222, 310 and 322 exposed. In some implementations, the metal layer 404 defines the heat-dissipation layer 230 of the substrate 400. The heat-dissipation layer 230 provides a means for heat dissipation. The means for heat dissipation may provide an electrical path for a ground signal.

Figure 4F:
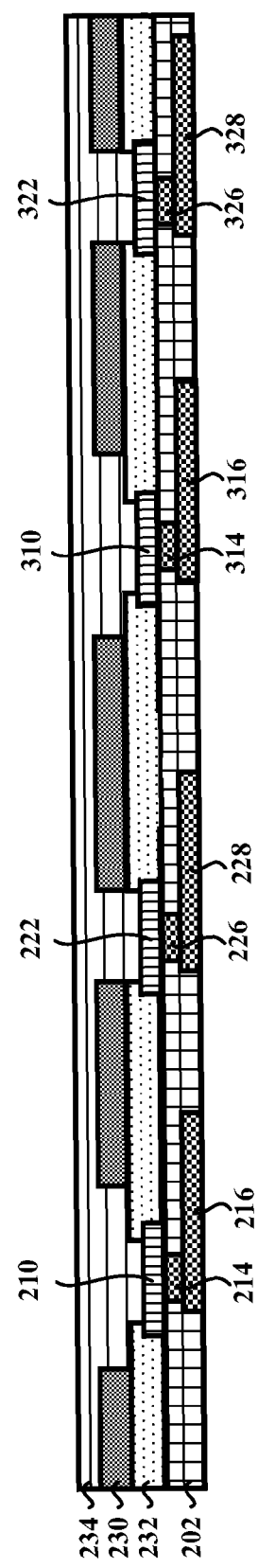

FIG. 4F illustrates the substrate 400 after a solder-resist layer 234 is provided on the heat-dissipation layer 230, the pads 210, 222, 310, 322, and the dielectric layer 232.

Figure 4G:
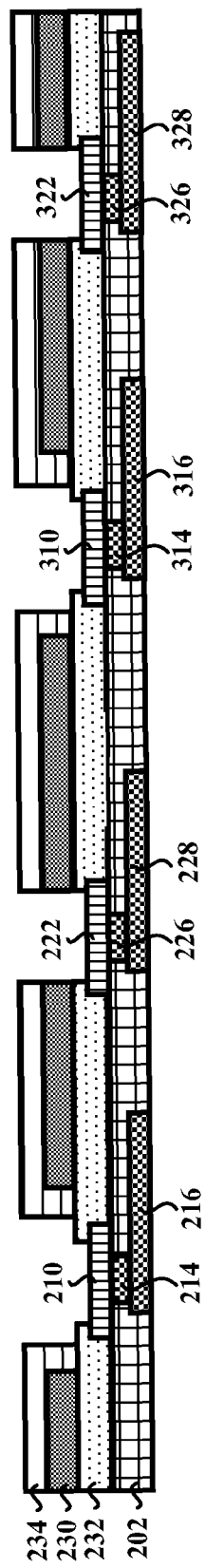

FIG. 4G illustrates the substrate 400 after various portions of the solder-resist layer 234 are selectively removed (e.g., etched). The portions of the solder-resist layer 234 that are removed (e.g., etched) may be the portions located above and/or near the pads 210, 222, 310, 322. The size of some removed portions (of the solder-resist layer 234) may be larger than the size of some other removed portions (of the solder-resist layer 234). For example, the size of the removed portions (of the solder-resist layer 234) near pads 222, 322 is smaller than the size of the removed portions (of the solder-resist layer 234) near pads 210, 310.

Figure 4H:
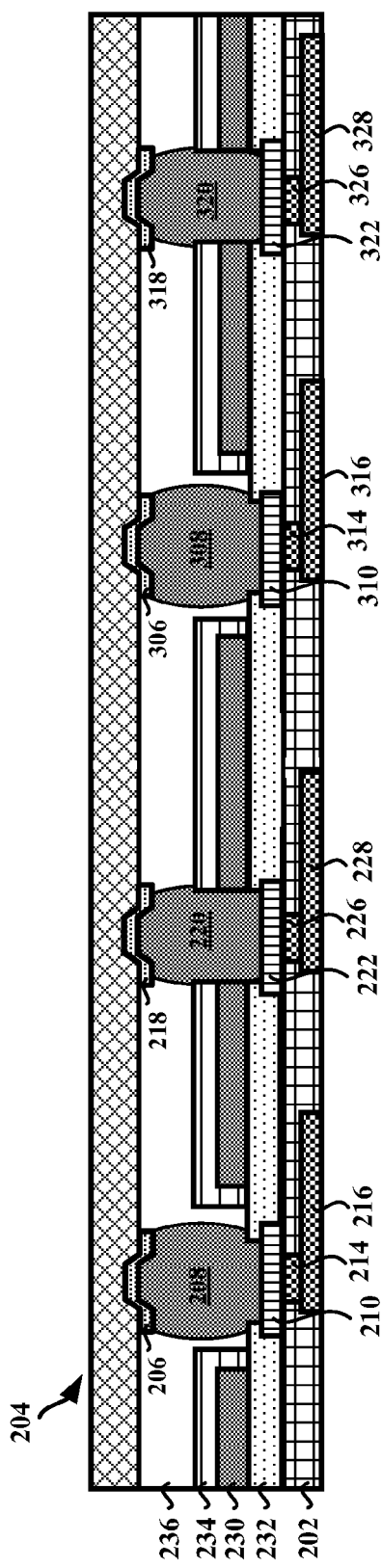

FIG. 4H illustrates the substrate 400 after the die 300 is coupled to the substrate 400. The die 204 may include a first under bump metallization (UBM) layer 206, a first solder ball 208, a second UBM layer 218, a first solder ball 208, and a second solder ball 220. The die 204 may be an integrated circuit or any other semiconducting material having one or more circuits (e.g., active circuits). The first UBM layer 206 is coupled to the first solder ball 208, and the second UBM layer 218 is coupled to the second solder ball 220. Although the example illustrated shown in FIG. 4I shows the die 204, the UBMs 206, 218, 306, 318, and the solder balls 208, 220, 308, 320 being provided in a single step, one of ordinary skill will understand that these elements may be provided in sub-steps without deviating from the scope of the present disclosure. Because the portions of the heat-dissipation layer 230 near pads 210, 310 were covered by the solder-resist layer (see, e.g., FIG. 4G), the solder balls 208, 308 may not electrically couple to the heat-dissipation layer 230 (see, e.g., FIG. 4H). However, because the portions of the heat-dissipation layer 230 near pads 222, 322 were not covered by the solder-resist layer 234 (i.e., were exposed) (see, e.g., FIG. 4G), the solder balls 220, 320 may couple to the heat-dissipation layer 230 (see, e.g., FIG. 4H).

After the die 204, the UBMs 206, 218, 306, 318, and the solder balls 208, 220, 308, 320 are provided, an underfill 236 may be provided (e.g., injected or inserted) in the space underneath the die 204, as illustrated in FIG. 4H. The underfill 236 may provide structural and/or mechanical support to the integrated device, particularly to the die 204, the UBMs 206, 218, 306, 318, and/or the solder balls 208, 220, 308, 320. The underfill 236 may be any material that is suitable for being provided into a space under the die (e.g., die 204), as described in greater detail supra.

Figure 5:
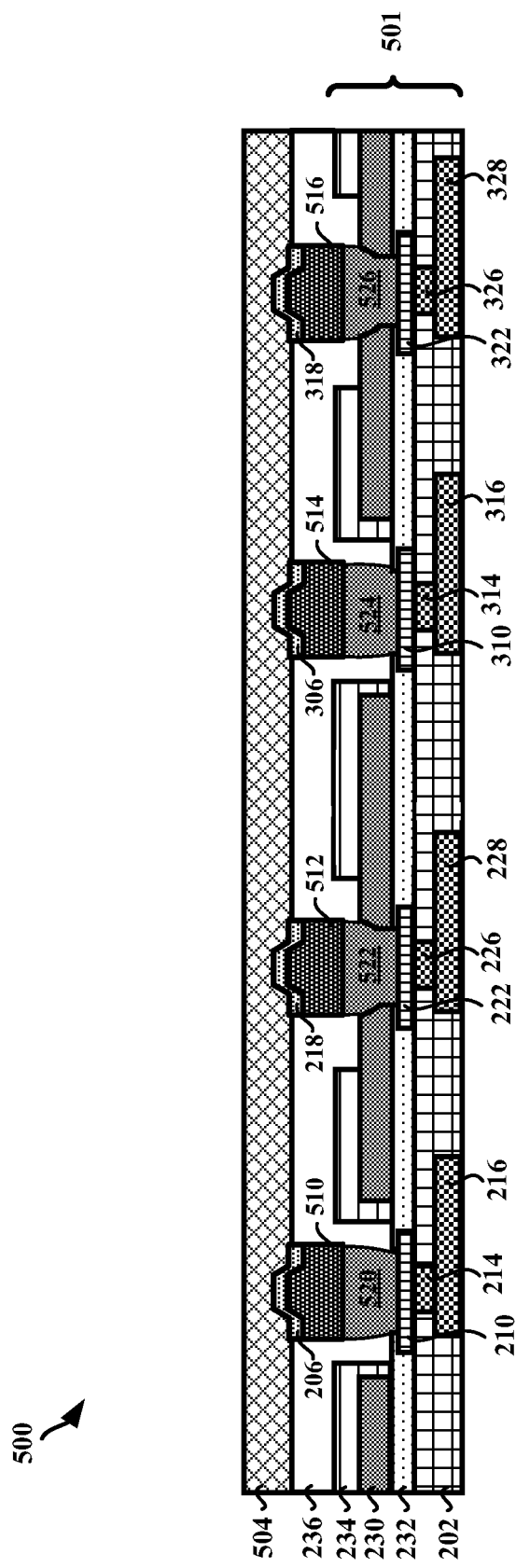
FIG. 5 illustrates a fourth exemplary integrated device.

FIG. 5 illustrates another example of an integrated device 500. In comparison to the integrated devices 200, 300 in FIGS. 2-3, which includes solder balls 208, 220, 308, 320 being directly coupled to respective UBM layers 206, 218, 306, 318, the integrated device 500 in FIG. 5 includes pillars 510, 512, 514, 516 between their respective UBM layers 206, 218, 306, 318, and their respective solder balls 520, 512, 514, 516. The substrate 301 includes a first pad 210, a second pad 222, a third pad 310, a fourth pad 322, a first dielectric layer 232, a heat dissipation layer 230, and a solder resist layer 234. The first pad 210 is coupled to the via 214. The second pad 222 is coupled to the via 226. The third pad 310 is coupled to the via 314. The fourth pad 322 is coupled to the via 326. The dielectric layer 232 is located on the substrate 301. There are cavities in the dielectric layer 232 over the first pad 210, the second pad 222, the third pad 310, and the fourth pad 322. The heat dissipation layer 230 also includes several cavities.

Exemplary Methods for Providing/Fabricating Exemplary Integrated Devices

Figure 6:
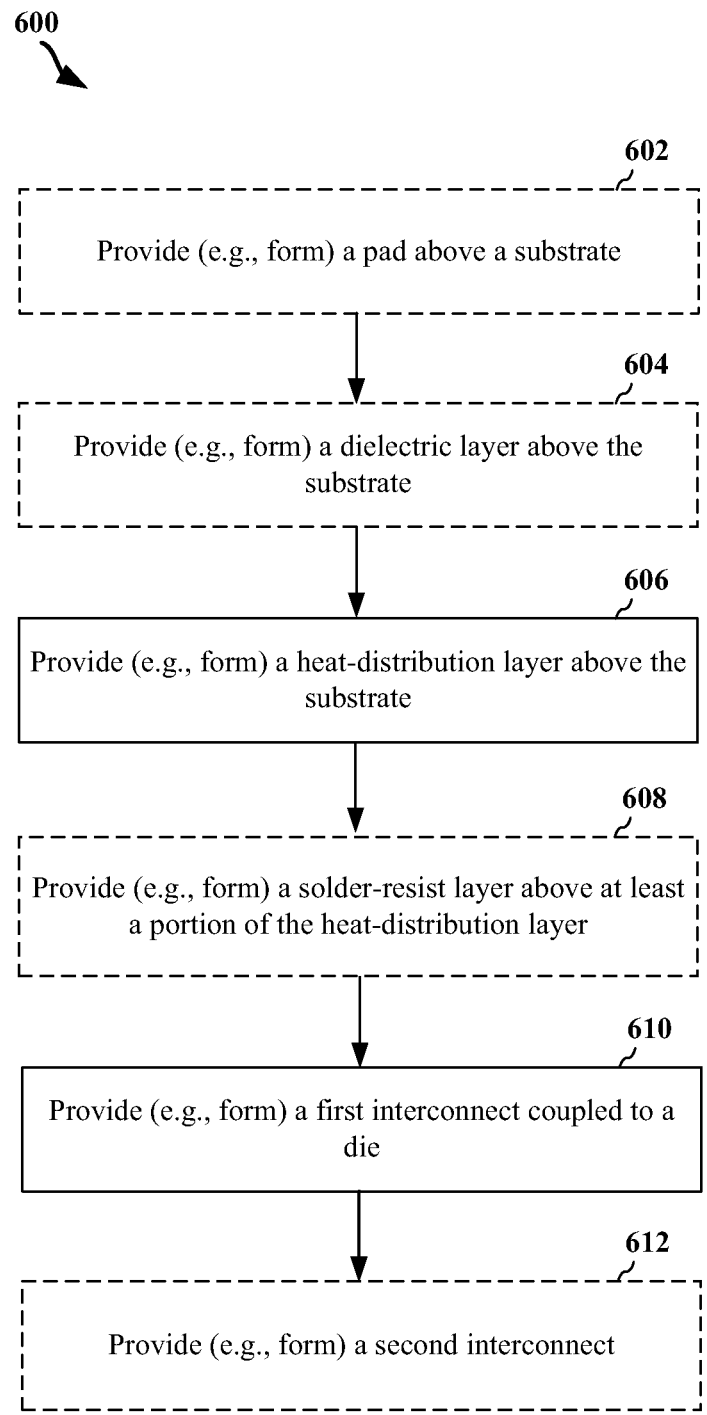
FIG. 6 illustrates an exemplary flow diagram of various methods for providing/fabricating an integrated device.

FIG. 6 illustrates an exemplary flow diagram of exemplary method 600 for providing/fabricating exemplary integrated devices. The exemplary method 600 may provide/fabricate any one or more of the integrated devices illustrated supra (e.g., integrated devices 200, 300, 500). One of ordinary skill in the art will understand that the order of some of the blocks illustrated in FIG. 6 may be changed without deviating from the scope of the present disclosure. Also, one of ordinary skill in the art will also understand that any one or more of the blocks illustrated in FIG. 6 may be combined without deviating from the scope of the present disclosure. Optional blocks are illustrated in dashed lines. Detailed descriptions of various elements mentioned infra are provided supra and therefore will not be repeated. The exemplary methods described herein may be performed by an apparatus (e.g., a manufacturing device).

At block 602, the apparatus may provide (e.g., form) a pad above a substrate. For example, referring to FIG. 4A, the apparatus may provide (e.g., form) a metal layer 402 above the substrate 202. Subsequently, referring to FIG. 4B, the apparatus may remove (e.g., etch) various portions of the metal layer 402, thereby forming the pads 210, 222, 310, 322 on the substrate 202.

At block 604, the apparatus may provide (e.g., form) a dielectric layer above the substrate. For example, referring to FIG. 4C, the apparatus may form (e.g., provide) a dielectric layer 232 over the pads 210, 222, 310, 322 and the substrate 202. Subsequently, referring to FIG. 4D, the apparatus may remove (e.g., etch) various portions of the dialectic layer 232.

At block 606, the apparatus may provide (e.g., form) a heat-dissipation layer above the substrate. For example, referring to FIG. 4E, the apparatus may provide (e.g., form) a metal layer 404 over the dielectric layer 232 and the pads 210, 222, 310, 322, thereby forming a heat-dissipation layer (e.g., the heat-dissipation layer 230). The heat-dissipation layer 230 provides a means for heat dissipation. The means for heat dissipation may provide an electrical path for a ground signal.

At block 608, the apparatus may provide (e.g., form) a solder-resist layer above at least a portion of the heat-dissipation layer 230. For example, referring to FIG. 4F, the apparatus may provide (e.g., form) a solder-resist layer 234 above the heat-dissipation layer 230, the dielectric layer 232, and the pads 210, 222, 310, 322.

At block 610, the apparatus may provide (e.g., form) a first interconnect coupled to a die. For example, referring to FIG. 4H, the apparatus may provide (e.g., form) the solder balls 220, 320, which are coupled to the die 204 (via UBMs 218, 318). As illustrated in FIG. 4H, the heat-dissipation layer 230 is coupled to the solder balls 220, 320 and may provide an electrical path for a ground signal. Further, the solder balls 220, 320 may conduct heat from the die 204 to the heat-dissipation layer 230.

At block 612, the apparatus may provide (e.g., form) a second interconnect. For example, referring to FIG. 4H, the die 204 may also include the solder balls 208, 308. The solder balls 208, 308 may conduct a power signal between the die 204 and the substrate 201. Also as described in greater detail supra, the underfill 236 may be provided (e.g., injected or inserted) in the space under the die 204.

Exemplary Electronic Devices

Figure 7:
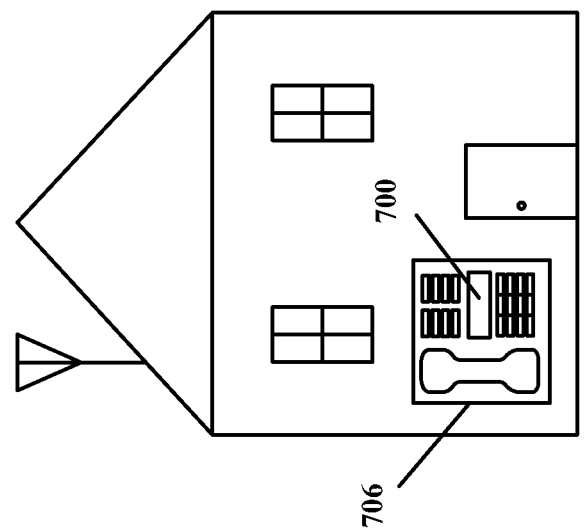
FIG. 7 illustrates various electronic devices that may integrate an integrated device, a semiconductor device, a die, an integrated circuit and/or printed circuit board (PCB) described herein.
Figure 7:
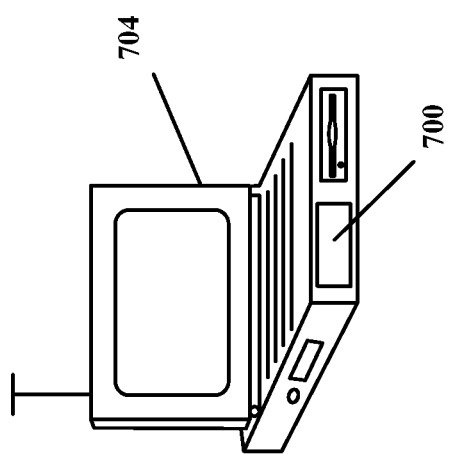
Figure 7:
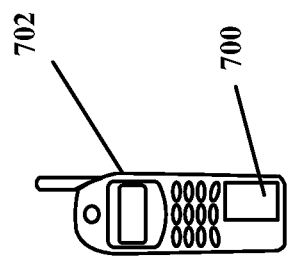

FIG. 7 illustrates various electronic devices that may be integrated with any of the aforementioned integrated device, semiconductor device, integrated circuit, die, interposer and/or package. For example, a mobile telephone 702, a laptop computer 704, and a fixed location terminal 706 may include an integrated device 700 described herein. The integrated device 700 may be, for example, any of the integrated circuits, dies, interposer, or packages described herein. The devices 702, 704, 706 illustrated in FIG. 7 are merely exemplary. Other electronic devices may also feature the integrated device 700 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4A-4H, 5, and/or 6 may be rearranged and/or combined into a single component, step, feature or function or embodied in several components, steps, or functions. Additional elements, components, steps, and/or functions may also be added without departing from the disclosure. FIGS. 2, 3, 4A-4H, 5, and/or 6 and its corresponding description in the present disclosure are not limited to dies and/or integrated circuits (IC). In some implementations, FIGS. 2, 3, 4A-4H, 5, and/or 6 and its corresponding description may be used to manufacture, create, provide, and/or produce integrated devices. In some implemented, an integrated device may include a die package, an IC, a wafer, a semiconductor device, and/or an interposer.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
   a substrate;
   a die;
   a heat-dissipation layer disposed on a surface of the substrate and located between the substrate and the die;
   a first interconnect configured to couple the die to the heat-dissipation layer, wherein the heat-dissipation layer is configured to provide an electrical path for a ground signal and the heat-dissipation layer is adjacent to the first interconnect; and
   a second interconnect configured to couple the die to the substrate, wherein the second interconnect is electrically isolated from the heat-dissipation layer by a solder-resist layer, wherein a portion of the solder-resist layer is vertically aligned between the die and the heat-dissipation layer.

2. The integrated device of claim 1, wherein the first interconnect is further configured to conduct heat from the die to the heat-dissipation layer, and to directly couple the die to the substrate.

3. The integrated device of claim 1, wherein the second interconnect is configured to conduct a power signal between the die and the substrate.

4. The integrated device of claim 1, wherein the second interconnect is configured to couple the die to the substrate through an opening in the heat-dissipation layer.

5. The integrated device of claim 1, further comprising:
a dielectric layer located between the heat-dissipation layer and the substrate.

6. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

7. The integrated device of claim 1, wherein the first interconnect is a solder ball.

8. The integrated device of claim 1, further comprising:
a pad disposed on the surface of the substrate;
wherein the heat-dissipation layer has an opening therein exposing at least a portion of the pad;
wherein the second interconnect is configured to couple the die to the pad through the opening in the heat-dissipation layer.

9. An apparatus comprising:
a substrate;
a die;
means for heat dissipation disposed on a surface of the substrate and located between the substrate and the die;
a first interconnect configured to couple the die to the means for heat dissipation, wherein the means for heat dissipation is configured to provide an electrical path for a ground signal and the means for heat dissipation is adjacent to the first interconnect; and
a second interconnect configured to couple the die to the substrate, wherein the second interconnect is electrically isolated from the means for heat dissipation by a solder-resist layer, wherein a portion of the solder-resist layer is vertically aligned between the die and the means for heat dissipation.

10. The apparatus of claim 9, wherein the first interconnect is further configured to conduct heat from the die to the means for heat dissipation, and to directly couple the die to the substrate.

11. The apparatus of claim 10, wherein the second interconnect is configured to conduct a power signal between the die and the substrate.

12. The apparatus of claim 10, wherein the second interconnect is configured to couple the die to the substrate through an opening in the means for heat dissipation.

13. The apparatus of claim 9, further comprising:
a dielectric layer located between the means for heat dissipation and the substrate.

14. The apparatus of claim 9, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

15. The apparatus of claim 9, wherein the first interconnect is a solder ball.

16. The apparatus of claim 8, further comprising:
a pad disposed on the surface of the substrate;
wherein the means for heat dissipation has an opening therein exposing at least a portion of the pad;
wherein the second interconnect is configured to couple the die to the pad through the opening in the means for heat dissipation.

17. An apparatus comprising:
a die;
a substrate comprising a first trace and a second trace;
a first pad coupled to the first trace;
a second pad coupled to the second trace; and
a heat-dissipation layer disposed on a surface of the substrate and located between the substrate and the die, the heat-dissipation layer is coupled to the second pad and configured to provide an electrical path for a ground signal, and wherein a first portion of the heat-dissipation layer is isolated from the first pad by a solder-resist layer and a second portion of the heat-dissipation layer is adjacent to the second pad, wherein a portion of the solder-resist layer is vertically aligned between the die and the heat-dissipation layer.

18. The apparatus of claim 17, wherein the second pad is configured to conduct heat from the substrate to the heat-dissipation layer, and to directly couple the die to the substrate.

19. The apparatus of claim 17, wherein the first pad and the first trace are configured to provide an electrical path for a power signal.

20. The apparatus of claim 17, wherein the second pad and the second trace are configured to provide an electrical path for a ground signal.

21. The apparatus of claim 17, further comprising a dielectric layer located between the heat-dissipation layer and the substrate.

22. The apparatus of claim 17, wherein the solder-resist layer is located above at least a portion of the heat-dissipation layer.

23. The apparatus of claim 17, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

24. The apparatus of claim 17, wherein the heat-dissipation layer has an opening therein exposing at least a portion of the second pad.

25. A method of fabricating an integrated device, the method comprising:
providing a heat-dissipation layer disposed on a surface of a substrate and located between the substrate and a die;
providing a first interconnect coupled to the die, wherein the first interconnect is adjacent to the heat-dissipation layer;
coupling the heat-dissipation layer to the first interconnect to provide an electrical connection for a ground signal;
providing a second interconnect configured to couple the die to the substrate; and
providing a solder-resist layer to electrically isolate the second interconnect from the heat-dissipation layer, wherein the solder-resist layer is provided above at least a portion of the heat-dissipation layer prior to providing the first interconnect.

26. The method of claim 25, further comprising:
providing a pad above the substrate prior to providing the heat-dissipation layer.

27. The method of claim 25, further comprising:
providing a dielectric layer above the substrate prior to providing the heat-dissipation layer.

28. The method of claim 25, wherein the first interconnect is configured to conduct heat from the die to the heat-dissipation layer, and to directly couple the die to the substrate.

29. The method of claim 25, wherein the second interconnect is configured to conduct a power signal between the die and the substrate.

30. The method of claim 29, further comprising:
electrically coupling the second interconnect to the substrate through an opening in the heat-dissipation layer.

31. The method of claim 25, wherein the method is performed by an integrated device that is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

32. The method of claim 25, wherein providing the first interconnect includes providing a solder ball coupled to the die.

33. The method of claim 25, further comprising:
providing a pad disposed on the surface of the substrate;
forming an opening in the heat-dissipation layer to expose at least a portion of the pad; and
coupling the second interconnect to the pad through the opening in the heat-dissipation layer.

* * * * *